United States Patent
Colbourne et al.

(10) Patent No.: US 6,560,252 B1
(45) Date of Patent: May 6, 2003

(54) METHOD AND DEVICE FOR WAVELENGTH LOCKING

(75) Inventors: Paul Colbourne, Nepean (CA); Jasvinder Obhi, Nepean (CA); Derek J. Glennie, Manotick (CA); James Vallance, Grimsby (CA)

(73) Assignee: JDS Uniphase Inc., Ottawa (CA)

( * ) Notice: Subject to any disclaimer, the term of this patent is extended or adjusted under 35 U.S.C. 154(b) by 266 days.

(21) Appl. No.: 09/620,417

(22) Filed: Jul. 20, 2000

(51) Int. Cl.[7] .................................................. H01S 3/13
(52) U.S. Cl. ...................... 372/32; 372/29.02; 359/247; 359/260
(58) Field of Search ................................ 372/32, 29.02; 359/247, 260

(56) References Cited

U.S. PATENT DOCUMENTS 5,798,859 A * 8/1998 Colbourne et al. ......... 359/247
6,243,403 B1 * 6/2001 Broutin et al. .............. 372/32

\* cited by examiner

*Primary Examiner*—Paul Ip
*Assistant Examiner*—Leith Al-Nazer
(74) *Attorney, Agent, or Firm*—Neil Teitelbaum

(57) ABSTRACT

A system for wavelength locking i.e. for maintaining a frequency of an optical signal to within predetermined limits has means for splitting part of the controlled optical signal into at least three sub-beams of which one is a reference beam and two others are provided to an optical element having a periodic output response and to a filter having a monotonic output response. The three detected outputs are analyzed and processed to determine accurately the wavelength of the optical signal and to produce a correcting signal if it is not within the predetermined limits.

15 Claims, 2 Drawing Sheets

METHOD AND DEVICE FOR WAVELENGTH LOCKING

FIELD OF THE INVENTION

This invention relates to a device and method for wavelength locking.

BACKGROUND OF THE INVENTION

There are many applications in the fields of telecommunications, medical instrumentation, optical computing and many other areas where it is required to have n optical signal having a non-varying centre wavelength within predetermined limits. In order to demultiplex a multiplexed optical signal having a plurality of optical channels, each having a unique centre wavelength, and some channel spacing between adjacent channels, it is necessary to have relatively stable channels, wherein the centre wavelengths do not vary significantly, otherwise cross-talk between adjacent channels would jeopardise the integrity of data contained therein.

Devices are commercially available that perform the function of "wavelength-locking". However, more often than not, these devices are very costly and are sensitive to temperature change. One such wavelength locking device is offered for sale by Accuwave of Santa Monica, Calif., U.S.A. By inputting a single frequency signal into the device, an output signal results with peaks on either side of a desired center wavelength. This device uses a lithium niobate block into which a volume hologram is written. The device is expensive owing to the high cost of the lithium niobate material and the difficulty in writing precision volume holograms. Furthermore, once a hologram is written into the material, the grating is fixed and cannot be changed. The Accuwave device has thermoelectric temperature control and has a variance of about 7 picometers per degree. Another limitation of this design is that it is only suitable for operating at a temperature of 15–40 degrees. U.S. Pat. No. 5,798,859 in the name of Colbourne et al., entitled Method and device for wavelength locking, describes an etalon based system. Another system in the name of the same inventor is described in U.S. Pat. No. 5,896,193 wherein an etalon is used in combination with a Bragg grating to determine within predetermined limits the wavelength of an optical signal.

A Fabry-Perot etalon has a periodic output response to broadband input light. Peaks and valleys of an etalon having a particular free spectral range correspond to predetermined wavelengths. Thus an etalon can be used as a measure of a signal's wavelength. However, since the output response is periodic, it must be determined which period or range between two periods correspond to a particular wavelength since the output response repeats with regularity. U.S. Pat. No. 5,986,193 uses a notch response of a Bragg grating in combination with an etalon as target; this target or notch corresponding to a known wavelength can be used as a counter to a particular period corresponding to an input wavelength of light.

One requirement of a wavelength locker is that it be relatively fast, that is, that it has a substantially fast response time to an input signal. The same applies to a circuit for measuring the wavelength of an input signal. It is an object of this invention to provide a wavelength locking circuit that has a fast response time and which is highly accurate.

It is also an object of this invention to provide a wavelength locking circuit that is relatively inexpensive to manufacture.

SUMMARY OF THE INVENTION

In accordance with the invention, there is provided a device for maintaining a frequency of an optical signal, typically a narrowband optical signal, to within predetermined limits, the device comprising: a periodic filter having a periodic output response to a multi-wavelength input signal, the periodic filter optically coupled to receive a portion of the optical signal and for providing a first output response thereto;

a filter having a single-slope, or monotonically varying output response to a multi-wavelength input signal, the filter optically coupled to receive a portion of the optical signal and for providing a second output response thereto;

detector means for detecting relative intensities of the first and the second output response, a third detector for detecting the intensity of another portion of the optical signal; and processing means for analyzing outputs from the first, second and third detector to provide an indication whether the wavelength of the optical signal is within a predetermined limit.

In an embodiment of the invention, the processing means are means for comparing the relative intensities of the first output response and the second output response with relative intensity of another portion of the input signal, and for providing an indication of the wavelength of the input signal.

The processor, or another device, may then provide an output or signal for adjusting the wavelength of the input optical signal to be locked if the wavelength is not within the predetermined limits.

For the purposes of the present specification, the definition "single-slope" or "monotonic" denotes, in accordance with the Webster Ninth Collegiate Dictionary, functions that either never increase or never decrease as the independent variable increases. In other words, a first derivative of such a function would be either at least zero or at most zero. Monotonic functions may be stepped i.e. may have horizontal (flat) segments. However, in order to define unequivocally the wavelength position on the periodic output function, the horizontal, or flat, segment(s) should not be longer than a single period of the periodic function. The function should be continuous over the range of periods of interest of the periodic function.

Exemplary monotonic functions for the purposes of the invention are illustrated in FIG. 4.

In a more specific embodiment of the invention, the device comprises:

a) means for splitting at least a portion of the optical signal into at least three sub-beams;

b) a first optical element having a periodic output, optically coupled to receive at least one of the at least three sub-beams;

c) a first detector optically coupled with the first optical element for detecting the intensity of light emitted from the first optical element;

d) a second optical element having a response that varies monotonically over a range of wavelengths corresponding to a plurality of periods of the first optical element, the second element being optically coupled to receive at least another of the at least three beams;

e) a second detector for detecting the intensity of light received from the second optical element;

f) a third detector for detecting the intensity of a third of the at least three sub-beams;

g) processing means for analyzing outputs from the first, second and third detector to provide an indication whether the frequency of the optical signal is within a predetermined limit, and for providing an output for adjusting the frequency of the optical signal if the frequency is not within the predetermined limits.

In an embodiment of the invention, the processing means is designed for providing an indication of wavelength that corresponds to the detected intensity of light received from the second optical element and from the third sub-beam and for utilizing the indication of wavelength and} a comparison of the relative intensity of the light detected to determine if a frequency is within the predetermined limits, and for providing an output for adjusting the frequency of the optical signal if the frequency is not within the predetermined limits.

In accordance with another aspect of the invention, there is provided a method of maintaining a frequency of an optical signal to within predetermined limits comprising the steps of:

directing a portion of the optical signal to a first optical element having a predetermined periodic output response and detecting the intensity of light emitted from the first optical element, directing another portion of the optical signal to a second optical element having a predetermined response that varies monotonically over a range of wavelengths corresponding to a plurality of periods of the first optical element while detecting the intensity of light received from the second optical element;

detecting the intensity of another portion of the optical signal; and analyzing the detected intensities to provide an indication whether the frequency of the optical signal is within a predetermined limit, and providing an output for adjusting the frequency of the optical signal if the frequency is not within the predetermined limits.

In an embodiment of the invention, the method comprises the steps of:

a) providing an input beam that is a portion of the optical signal;

b) splitting the input beam into at least three sub-beams;

c) directing a first of the three sub-beams to an first optical element having a predetermined periodic output response while detecting the intensity of light emitted from the first optical element;

d) directing a second of the at least three sub-beams to a second optical element having a predetermined response that varies monotonically over a range of wavelengths corresponding to a plurality of periods of the first optical element while detecting the intensity of light received from the second optical element;

e) detecting the intensity of a third of the at least three sub-beams; and f) analyzing outputs from the first, second and third detector to provide an indication whether the frequency of the optical signal is within a predetermined limit, and providing an output for adjusting the frequency of the optical signal if the frequency is not within the predetermined limits.

In accordance with still another aspect of the invention, there is provided a method for providing an indication of a wavelength of a narrowband input signal comprising:

launching a portion of the narrowband input singnal into a periodic filter having a periodic output response to a multi-wavelength input signal and detecting intensity information related to an output signal received therefrom;

launching a portion of the narrowband input signal into a filter having a monotonically varying output response to the multi-wavelength input signal and detecting intensity information related to an output signal received therefrom; and, processing the intensity information with intensity information related to another portion of the input signal to obtain an indication of the wavelength of the narrowband input signal.

BRIEF DESCRIPTION OF THE DRAWINGS

Exemplary embodiments of the invention will now be described in more detail in conjunction with the drawings in which.

DETAILED DESCRIPTION OF THE INVENTION

Figure 1:
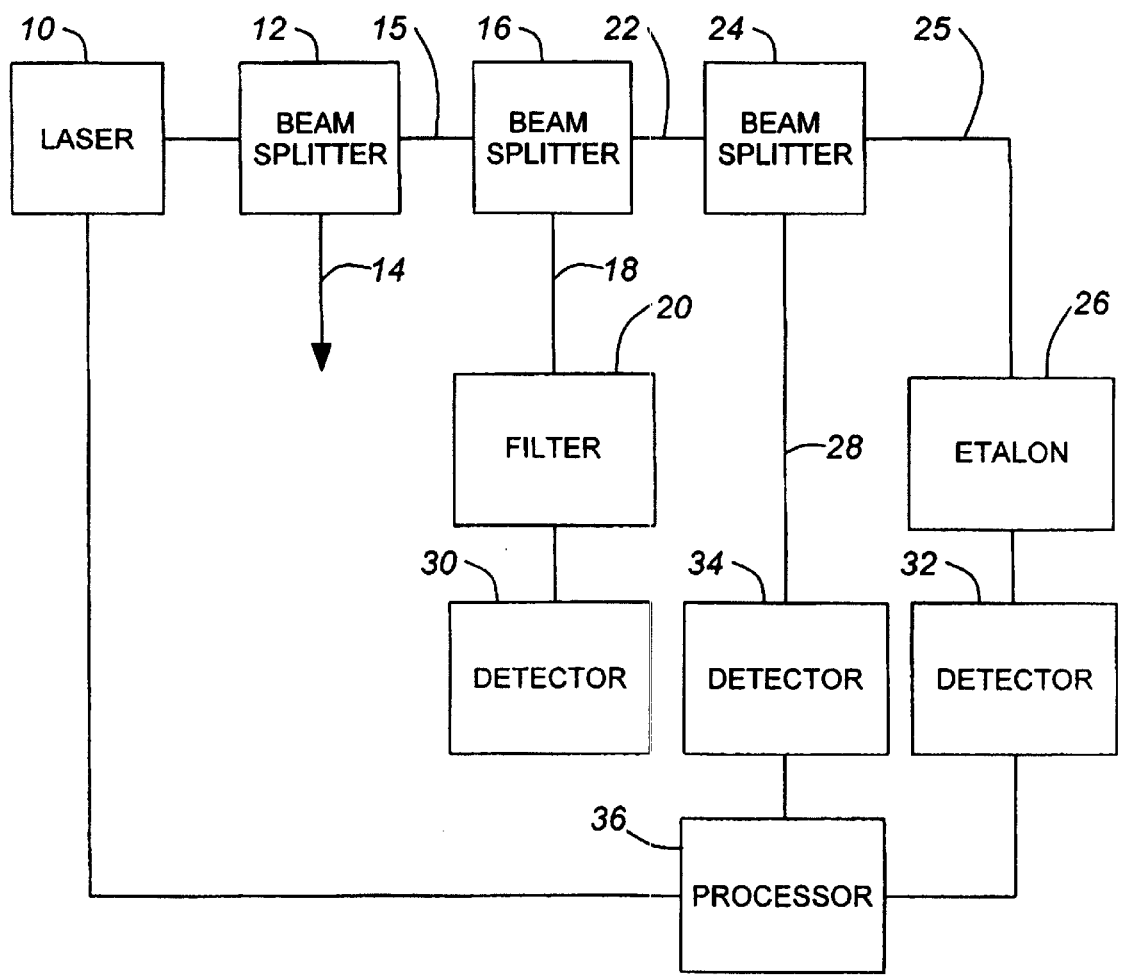
FIG. 1 is a schematic block diagram of a wavelength locking system.

Referring to FIG. 1, an exemplary wavelength locking device of the invention features a tunable laser 10 capable of emitting a narrowband optical signal e.g. for telecommunication purposes. A transmission/reflection beam splitter 12, e.g. a 95%/5% beam splitter is coupled to the laser to enable most of the optical output 14 of the laser to be used for telecommunication. It is of course feasible to use other split ratios, e.g. 80–20% or 70–30% depending of specific requirements of the transmission system.

The reflected 5% beam 15 is coupled to a second beam splitter 16 which splits the reflected beam 15 into a sub-beam 18 which is provided to a monotonic filter 20, and a sub-beam 22 which is provided to another beam splitter 24.

The splitter 24 produces a sub-beam 25 that is provided to a periodic filter 26, and a reference sub-beam 28. In the embodiment illustrated, the periodic filter 26 is a Fabry-Perot etalon having a predetermined free spectral range FSR, and thus a predetermined periodic amplitude vs. wavelength output characteristics. The monotonic filter 20 produces a predetermined output response which in the specific embodiment shows a linear sloped relationship between the amplitude and a range of wavelengths corresponding to a plurality of periods of the element 26.

The output of the filter 20 is detected by a detector 30, while the outputs of the periodic filter 26 and of the reference sub-beam 28 are detected by detectors 32 and 34 respectively.

The detectors 30, 32 and 34 are coupled to a suitably programmed processor 36, to analyse the outputs and determine the frequency (or corresponding wavelength) of the optical signal emitted by the laser 10. If the wavelength is not within predetermined limits suitable for the e.g. telecommunication purposes, the processor provides a control signal for adjusting the frequency (wavelength) of the signal emitted by the laser.

Figure 2:
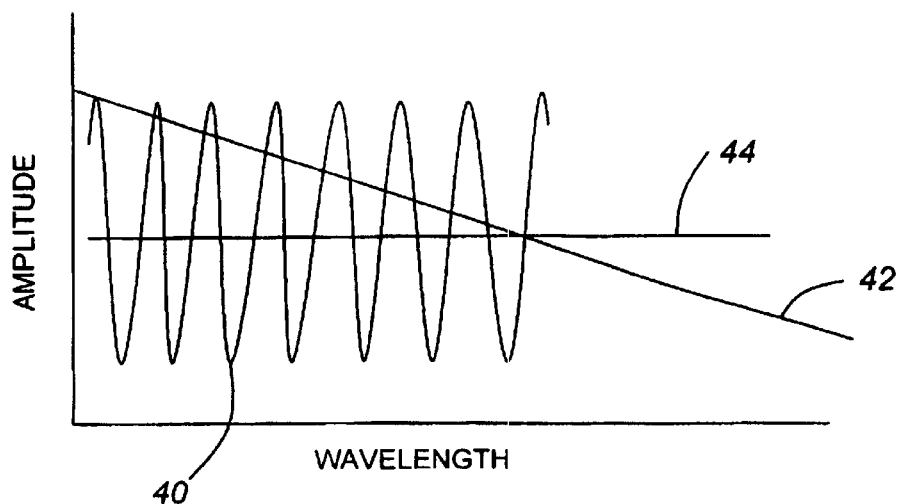
FIG. 2 is a graph of amplitude responses over wavelength of the optical elements of the system of FIG. 1 when emitting a broadband optical signal.
Figure 4:
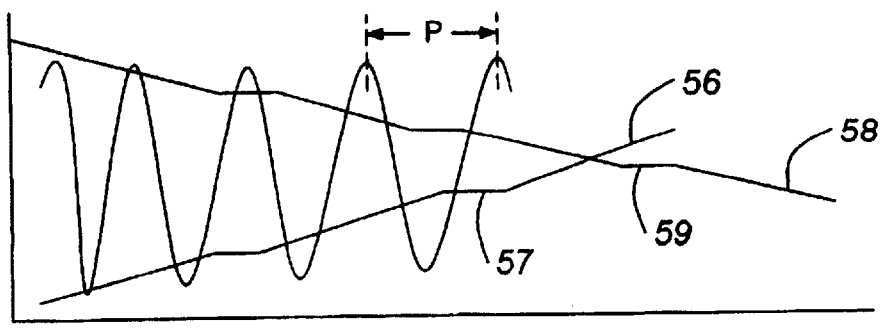
FIG. 4 illustrates exemplary monotonic output responses of the filter of the invention.

In FIG. 2, presented herein for explanatory purposes, the periodic outline 40 represents the amplitude output vs. wavelength of the etalon 26 when the input signal is a broadband beam, e.g. white light. The sloped line 42 represents the amplitude output of a monotonic (sloped) filter 20 when the input is also a broadband light. The horizontal line 44 graphically represents, the amplitude vs. wavelength response of the reference beam 28. The filter 20 may be selected such that the line 42 is replaced with a descending or rising curve, as seen in FIG. 4.

The periods of the outline 40 are very narrow to accommodate the ITU (International Telecommunications Union), wavelength requirements. However, as mentioned earlier, knowing the amplitude detected by the detector 32 is not sufficient to identify the wavelength since the periods of the output response repeat with regularity.

It is the predetermined amplitude-wavelength characteristic of the line (or curve) 42 that enables determination with good accuracy of the period of the output response 40. If the intensity of the input signal never varies, intensity information related to the periodic response and the sloped response are sufficient to calculate the exact wavelength of an input narrowband signal. However, since the intensity may vary, the reference output is necessary to establish a relationship between the amplitude of the reference beam 44 and the sloped response 42 of the filter 20. This comparison provides a baseline for determining the actual wavelength of a narrowband input signal of the tunable laser 10.

Figure 3A:
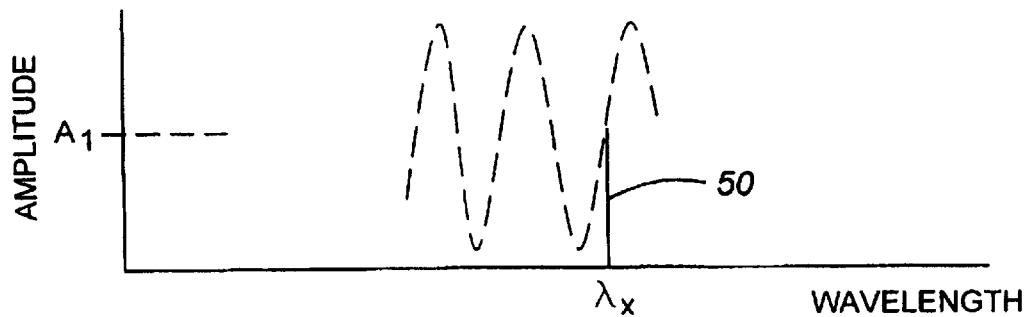
FIG. 3a is a graph of amplitude vs. wavelength of a first periodic optical element of the system of FIG. 1 when emitting a narrowband optical signal.
Figure 3B:
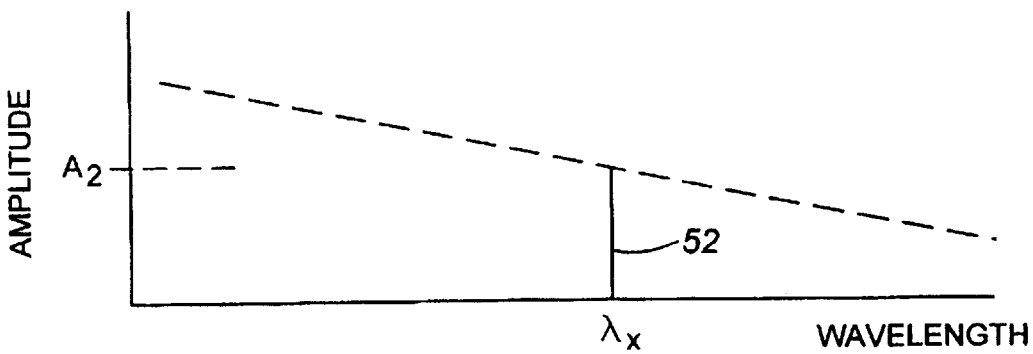
FIG. 3b is a graph of amplitude vs. wavelength of a second monotonic optical element of the system of FIG. 1 when emitting a narrowband optical signal.
Figure 3C:
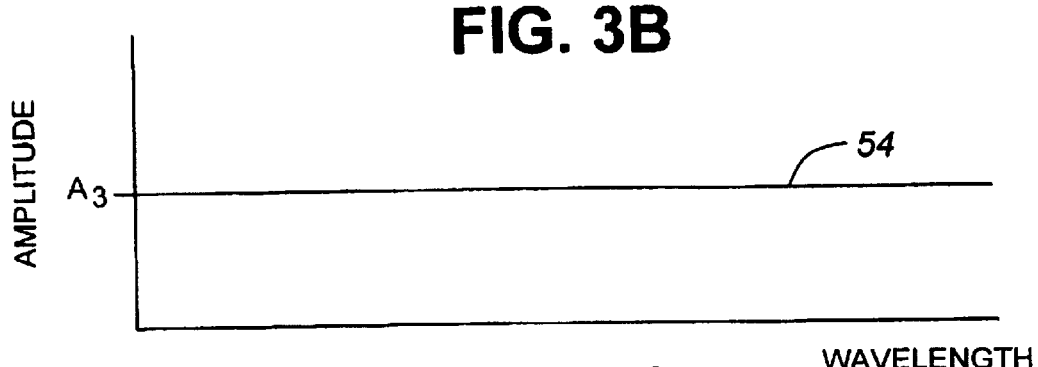
FIG. 3c is a graph of amplitude vs. wavelength of a reference sub-beam derived from the narrowband optical signal of the system of FIG. 1.

FIGS. 3a–3c illustrate the above explanation. As seen in FIG. 3a, when the input signal is a narrow band beam, the output response of the periodic filter 26 will is shown as represented by a bar 50 having an amplitude $A_1$ and corresponding to a wavelength $\lambda$ x. The phantom line illustrates the periodic response corresponding to a broadband signal as in FIG. 2. Similarly, FIG. 3b shows that the response of the monotonic (sloped) filter 20 is represented by a bar 52 having an amplitude $A_2$ approximately at a wavelength $\lambda$ x. It will be noted that while the periodic response is very precise, the sloped response of a monotonic filter is rather coarse in comparison, but sufficient to "localize" the period of the periodic response.

FIG. 3c represents, as in FIG. 2, the horizontal output response 54 of the amplitude of the reference beam vs. wavelength. The detected amplitude serves as a tester for the detected wavelength. As the intensity of the optical signal of the laser changes, the amplitude of the reference beam 54 changes and so does the slope of the line (curve) 52. The relationship establishes a baseline to determine accurately the wavelength of the optical signal of the laser. Consequently, as explained above, an output is provided to the laser 10 (or to a wavelength selector of the laser, not shown herein) for adjusting the wavelength or frequency to within predetermined limits.

FIG. 4 shows two exemplary non-linear monotonic output responses f the filter 20. It will be seen that the curve 56 has a positive slope i.e. it never decreases, and its first derivative is zero or a positive value. The curve 56 has flat segments 57 that are not longer than the period P of the periodic response of the etalon 26. Conversely, the curve 58 has a negative slope i.e. its first derivative is never greater than zero. Curve 58 has flat segments 59 that are not longer than the period of the response of the etalon 26. This characteristics of the monotonic function enables unambiguous identification of the wavelength of the optical signal in question.

It will be appreciated that the present invention provides a device and method for providing the basic function of the Accuwave prior art device at less cost using a periodic output device.

The Fabry-Perot etalon used in an embodiment of the invention is a wavelength dependent device having a periodic amplitude output response that varies periodically with a changing wavelength of an input signal.

The embodiments of the invention described and illustrated herein are not limiting nor exhaustive, and the invention will be understood to encompass all equivalents of the features and elements described and illustrated hereinabove.

We claim:

1. A device for maintaining a wavelength of an optical signal to within predetermined limits, the device comprising: a periodic filter having a periodic output response to a multi-wavelength input signal, the periodic filter optically coupled to receive a portion of the optical signal and for providing a first output response thereto;

a filter having a monotonically varying output response to a multi-wavelength input signal, the filter optically coupled to receive a portion of the optical signal and for providing a second output response thereto;

first detector means for detecting intensities of the first and the second output response respectively, second detector means for detecting the intensity of another portion of the optical signal;

processing means for analyzing outputs from the first detector means and second detector means to provide an indication whether the wavelength of the optical signal is within a predetermined limit.

2. The device of claim I further comprising means for adjusting the wavelength of the optical signal if the wavelength is not within the predetermined limits.

3. A device for maintaining a wavelength of an optical signal to within predetermined limits comprising:

a) means for splitting at least a portion of the optical signal into at least three sub-beams;

b) a first optical element having a periodic output optically coupled to receive at least one of the at least three sub-beams;

c) a first detector optically coupled with the first optical element for detecting the intensity of light emitted from the first optical element;

d) a second optical element having a response that varies monotonically over a range of wavelengths corresponding to a plurality of periods of the first optical element, the second element optically coupled to receive at least another of the at least three beams;

e) a second detector for detecting the intensity of light received from the second optical element;

f) a third detector for detecting the intensity of a third of the at least three sub-beams;

g) processing means for analyzing outputs from the first, second and third detector to provide an indication whether the wavelength of the optical signal is within a predetermined limit, and for providing an output for adjusting the wavelength of the optical signal if the wavelength is not within the predetermined limits.

4. The device of claim 1 wherein the processing means are means for providing an indication of wavelength that corresponds to the detected intensity of light received from the second optical element and from the third sub-beam and for utilizing the indication of wavelength and a comparison of the intensity of the light detected from the first optical element and the third sub-beam to determine if the wavelength is within the predetermined limits, and for providing an output for adjusting the wavelength of the optical signal if the wavelength is not within the predetermined limits.

5. An optical device for providing an indication of a wavelength of a narrowband input signal comprising:

a periodic filter having a periodic output response to a multi-wavelength input signal optically coupled to receive a portion of the narrowband input signal and for providing a first output response thereto;

a filter having a monotonically varying output response to the multi-wavelength input signal, optically coupled to receive a portion of the narrowband input signal and for providing a second output response thereto; and, detector means for detecting relative intensity information of the first output response, the second output response and of another portion of the optical signal, and a processor means coupled to receive detected intensity information from the detector means, for providing an indication of the wavelength of the narrowband input signal.

6. An optical device as defined in claim 1, wherein the monotonically varying output response is a sloped response.

7. The device of claim 1 wherein said periodic filter is a Fabry-Perot etalon.

8. The device of claim 5 wherein said periodic filter is a Fabry-Perot etalon.

9. A method of maintaining a frequency of an optical signal to within predetermined limits comprising the steps of:

directing a portion of the optical signal to a first optical element having a predetermined periodic output response and detecting the intensity of light emitted from the first optical element, directing another portion of the optical signal to a second optical element having a predetermined response that varies monotonically over a range of wavelengths corresponding to a plurality of periods of the first optical element while detecting the intensity of light received from the second optical element;

detecting the intensity of another portion of the optical signal; and analyzing the detected intensities to provide an indication whether the frequency of the optical signal is within a predetermined limit, and providing an output for adjusting the frequency of the optical signal if the frequency is not within the predetermined limits.

10. A method of maintaining a frequency of an optical signal to within predetermined limits comprising the steps of:

a) providing an input beam which is at least a portion of the optical signal;

b) splitting the input beam into at least three sub-beams;

c) directing a first of the three sub-beams to an first optical element having a predetermined periodic output response while detecting the intensity of light emitted from the first optical element;

d) directing a second of the at least three sub-beams to a second optical element having a predetermined response that varies monotonically over a range of wavelengths corresponding to a plurality of periods of the first optical element while detecting the intensity of light received from the second optical element;

e) detecting the intensity of a third of the at least three sub-beams; and f) analyzing outputs from the first, second and third detector to provide an indication whether the frequency of the optical signal is within a predetermined limit, and providing an output for adjusting the frequency of the optical signal if the frequency is not within the predetermined limits.

11. The method of claim 10 wherein step f) includes the sub-steps of g) determining from steps (d) and (e) an indication of wavelength that corresponds to the detected intensity of light received from the second optical element and from the third sub-beam;

h) utilizing the indication of wavelength and comparing the relative intensity of the light detected in steps (c) and (e) to determine if the frequency is within the predetermined limits; and, i) adjusting the frequency of the optical signal if the frequency is not within the predetermined limits.

12. A method as defined in claim 10 wherein the first optical element is a resonant optical cavity.

13. A method as defined in claim 10 wherein the second optical element is an optical filter having a sloped output response.

14. A method for providing an indication of a wavelength of a narrowband input signal comprising:

launching a portion of the narrowband input signal into a periodic filter having a periodic output response to a multi-wavelength input signal and detecting intensity information related to an output signal received therefrom;

launching a portion of the narrowband input signal into a filter having a monotonically varying output response to the multi-wavelength input signal and detecting intensity information related to an output signal received therefrom; and, processing the intensity information with intensity information related to another portion of the input signal to obtain an indication of the wavelength of the narrowband input signal.

15. The method of claim 14 wherein said periodic filter is a Fabry-Perot etalon.

* * * * *